(12) United States Patent
Bell

(10) Patent No.: US 6,882,946 B2
(45) Date of Patent: Apr. 19, 2005

(54) SPECTRAL ANALYSIS MEASUREMENT APPARATUS AND METHOD OF MEASURING FOR SPECTRAL ANALYSIS MEASUREMENT APPARATUS

(75) Inventor: Steven Bell, Fife (GB)

(73) Assignee: Agilent Technologies, Inc., Palo Alto, CA (US)

( * ) Notice: Subject to any disclaimer, the term of this patent is extended or adjusted under 35 U.S.C. 154(b) by 72 days.

(21) Appl. No.: 10/386,983

(22) Filed: Mar. 12, 2003

(65) Prior Publication Data

US 2003/0191595 A1 Oct. 9, 2003

(30) Foreign Application Priority Data

Apr. 6, 2002 (EP) .......................................... 02252495

(51) Int. Cl.[7] .............................................. G01R 23/16
(52) U.S. Cl. ............................ 702/76; 702/69; 702/74; 702/75; 455/423
(58) Field of Search ............................ 702/76, 69, 60, 702/61, 66, 67, 73–75, 106–109, 112, 117, 118, 124, 126, 183, 189; 455/423–425, 63.1, 67.11, 67.13, 67.14, 67.7, 9, 115.1–115.4, 226.1, 226.2, 226.4, 229, 194.2; 324/605, 602, 620, 624, 76.19, 76.22, 615, 629, 674, 681; 375/297, 224, 228; 370/241, 242; 345/736

(56) References Cited

U.S. PATENT DOCUMENTS

| | | | |
|---|---|---|---|
| 6,201,955 B1 * | 3/2001 | Jasper et al. ............. | 455/277.2 |
| 6,263,289 B1 | 7/2001 | Hassun et al. ................ | 702/69 |
| 6,512,788 B1 * | 1/2003 | Kuhn et al. ................. | 375/224 |
| 6,590,587 B1 * | 7/2003 | Wichelman et al. ........ | 345/736 |
| 2002/0027961 A1 | 3/2002 | Rexberg et al. ............. | 375/297 |
| 2002/0123321 A1 * | 9/2002 | Antoine et al. ............. | 455/296 |
| 2002/0127986 A1 * | 9/2002 | White et al. ............. | 455/194.2 |
| 2003/0013409 A1 * | 1/2003 | Buckshaw ..................... | 455/9 |

FOREIGN PATENT DOCUMENTS

EP  0977384 A1  2/2000

OTHER PUBLICATIONS

U.S. Appl. 60/273,987.*

* cited by examiner

Primary Examiner—Hal Wachsman

(57) ABSTRACT

A measuring apparatus includes a spectrum analysis unit having an input for receiving an input signal to be measured. The input signal includes a carrier signal located within a predetermined band of frequencies and the spectrum analysis unit is arranged to store a set of user definable parameters including the location of the carrier signal within the predetermined band of frequencies, and to use the set of user definable parameters to measure a quantity associated with the carrier signal.

13 Claims, 4 Drawing Sheets

SPECTRAL ANALYSIS MEASUREMENT APPARATUS AND METHOD OF MEASURING FOR SPECTRAL ANALYSIS MEASUREMENT APPARATUS

The present invention relates to a measuring apparatus of the type used, for example, to measure power of a carrier signal constituting a Radio Frequency (RF) channel, such as a transmit channel of an RF communications systems. The present invention also relates to a method of measuring power, for example, of the carrier signal.

Manufacturers of receiver amplifiers for use in spread-spectrum communications systems have a requirement to test outputs of the amplifiers during development and quality control processes associated with manufacture of the amplifiers. In this respect, it is necessary to test for correct amplification of carrier signals by a given amplifier and the effect of amplified carrier signals on adjacent, or other, carrier signals. One test for correct amplification of the input carrier signals involves measurement of power, within a predetermined band of frequencies, of amplified carrier signals and predetermined spaces absent of the amplified carrier signals generated by the given amplifier.

A first known measurement is an Adjacent Channel Power (ACP) measurement; a measure of absolute power leakage from a given transmit channel to adjacent transmit channels. However, the ACP measurement is only made with respect to a single carrier signal, and where more than one channel exists, the absolute power is only measured with respect to a main carrier signal.

A second known measurement is a Multi-Carrier Power (MCP) measurement; a measure of absolute power in two transmit channels, and absolute power leakage into adjacent transmit channels. However, the MCP measurement is currently limited to measuring two carrier signals, each having a bandwidth of 5 MHz and a maximum separation of 15 MHz.

Given the number of RF communications systems standards ("radio standards") in existence, for example Wideband-Code Division Multiple Access (W-CDMA), IS-95 and cdma2000, now employing more than two carrier signals, test equipment designed to perform the measurements as described above are either incapable of providing a meaningful measure of power with respect to all carrier signals of a given radio standard, or are incapable of automatically providing a measurement of all carrier signals, when more than two carrier signals exist, of the given radio standard.

According to a first aspect of the present invention, there is provided a measuring apparatus comprising a spectrum analysis unit having an input for receiving an input signal to be measured, the input signal comprising a carrier signal located within a predetermined frequency band, the spectrum analysis unit being arranged to store a set of parameters comprising the location of the carrier signal within the band of frequencies, and to use the set of parameters to measure a quantity associated with the carrier signal.

The set of parameters may further comprise a bandwidth of the carrier signal.

The set of parameters may further comprise a measurement bandwidth, the spectrum analysis unit being arranged to measure the quantity substantially over the measurement bandwidth. In particular the measurement bandwidth may be an integration bandwidth.

The set of parameters may further comprise an identification of the set of parameters.

The set of parameters may further comprise an indication of the presence of the carrier signal at the location within the predetermined band of frequencies.

The set of parameters may further comprise an identification that the carrier signal is a reference carrier signal.

The set of parameters may further comprise an identification of a frequency corresponding to a location of a reference carrier signal.

The input signal may comprise more than two carrier signals, the set of parameters further comprising respective locations of the more than two carrier signals within the band of frequencies.

The property associated with the carrier frequency to be measured may be power.

The set of parameters may be user-definable. The set of parameters may be set remotely using, for example, a Standard Commands for Programmable Instruments (SCPI) command.

In one embodiment a spectrum analyser is provided, comprising the measuring apparatus as set forth above in accordance with the first aspect of the present invention.

According to a second aspect of the present invention, there is provided a method of measuring for a measuring apparatus comprising a spectrum analysis unit having an input for receiving an input signal to be measured, the method comprising the following steps: receiving an input signal, the input signal comprising a carrier signal located within a predetermined frequency band; storing a set of parameters comprising the location of the carrier signal within the band of frequencies; and using the set of parameters to measure the quantity associated with the carrier signal.

According to a third aspect of the present invention, there is provided a computer program element comprising computer program code means arranged to make a computer execute the method as set forth above in accordance with the second aspect of the present invention.

The computer program element may be embodied on a computer readable medium.

It is thus possible to provide a measuring apparatus and a method therefor that permits a user to perform an MCP measurement in respect of carrier signals employed in a radio standard, in particular where more than two carrier signals are to be measured. The present invention obviates the need to measure power of each carrier signal separately, thereby greatly increasing the speed and hence efficiency of the MCP measurement. Additionally, it is possible to make measurements in respect of any combination of carrier signals and spaces (absences of carrier signals) within the predetermined band of frequencies. Also, by permitting the users to measure carrier signals of different bandwidths, greater flexibility is provided to users, because carrier signals of a larger number of different radio standards can be measured than was previously possible, the bandwidth of carrier signals varying between radio standards. Furthermore, efficiency in measuring the carrier signals is also improved, since separate sets of configuration parameters can be readily accessed/input for each carrier signal/space. An additional efficiency is achieved by virtue of the ability to set all, or substantially all, of the sets of parameters prior to making measurements, thereby enabling continual, uninterrupted, measurements to be made. The use of the SCPI command permits a given parameter to be set for a number of locations using a single SCPI command, thus also improving efficiency of the measurement process.

BRIEF DESCRIPTION OF THE DRAWINGS

At least one embodiment of the invention will now be described, by way of example only, with reference to the accompanying drawings, in which:

Referring to FIG. 1, a spectrum analyser 100 comprises a microprocessor 102 coupled to an output device, for example a Cathode Ray Tube (CRT) 104 and an input device, for example a keypad 106. The microprocessor 102 is also coupled to a first storage device, for example a volatile memory, such as a Random Access Memory (RAM) 108, and a second storage device, for example a non-volatile memory, such as a Read Only Memory (ROM) 109. It should, of course, be appreciated that other storage means can be employed in place of, or in addition to, the RAM 108 and/or the ROM 109. The spectrum analyser 100 provides an input port 110 to which a cable 112 can be connected, the cable constituting a propagation medium through which an input signal 111 to be measured can propagate to the input port 110. The input port 110 is coupled to the microprocessor 102.

Figure 1:
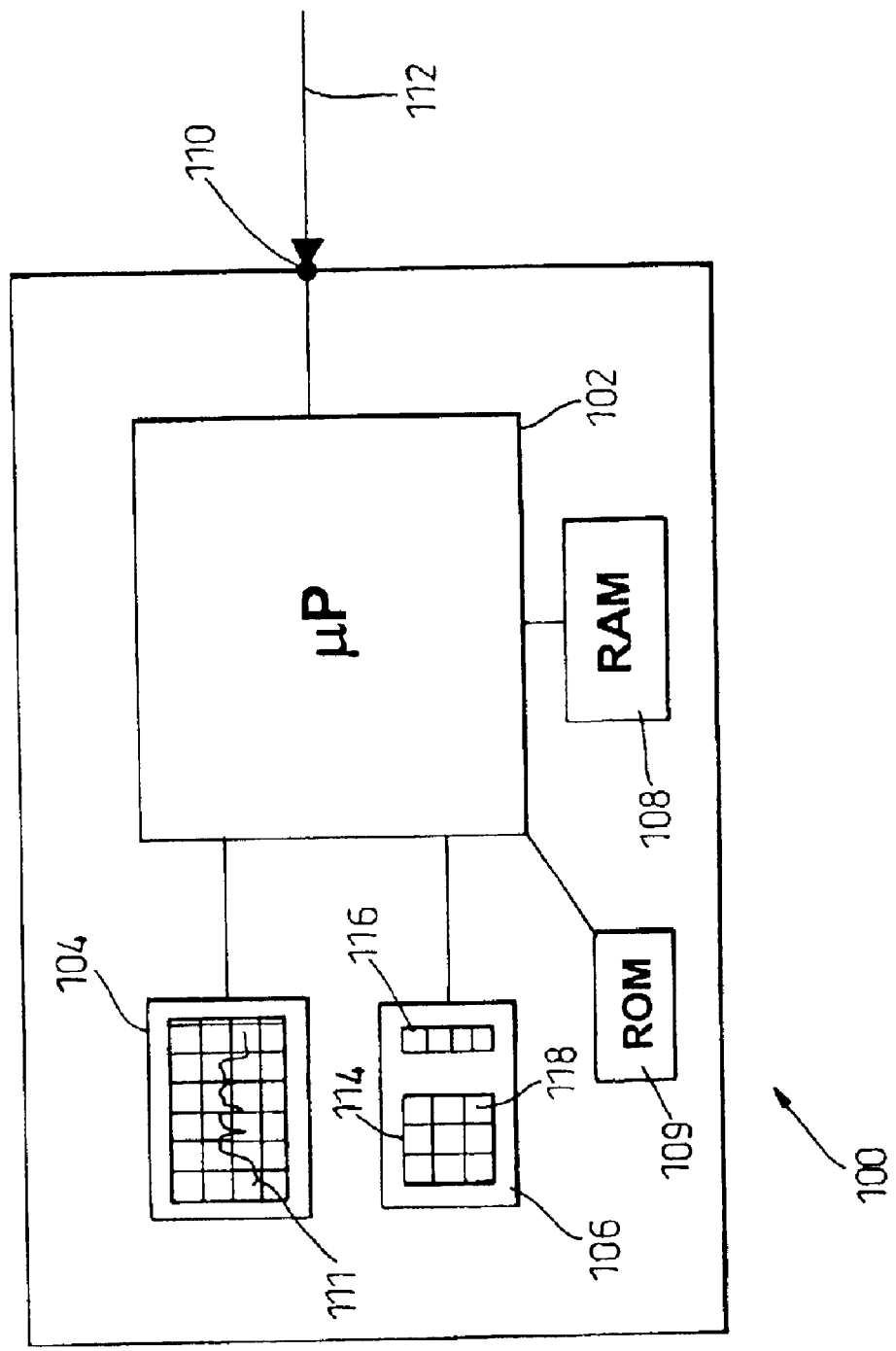
FIG. 1 is a schematic diagram of an apparatus constituting an embodiment of the invention.

The keypad 106 comprises an array of numeric keys 114; navigation keys, for example "soft" keys 116 disposed adjacent a rectangular graphical menu 400 (FIG. 4) displayed at a right hand side of the CRT 104; and an "enter" key 118 to confirm certain inputs.

Figure 2:
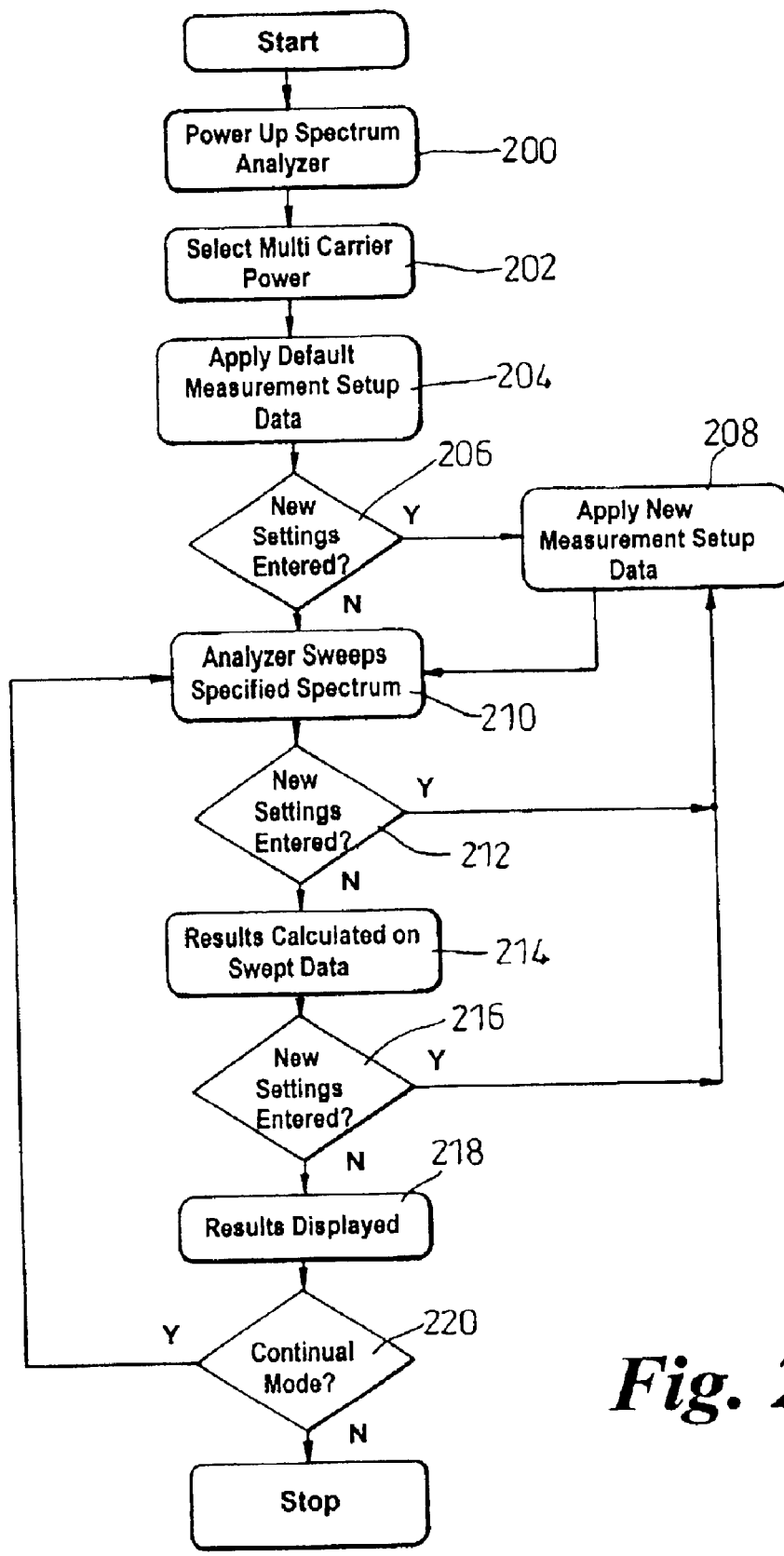
FIG. 2 is a flow diagram of a method of measuring power for the apparatus of FIG. 1.

In operation (FIG. 2), a user powers up (step 200) the spectrum analyser 100. Upon power-up, an option to carry out an MCP measurement appears in a panel (not shown) of the rectangular graphical menu 400, the option being selectable by depressing one of the soft keys 116 that is adjacent the panel (hereinafter referred to as the "MCP measurement key"). Subsequently, one end of the cable 112 is attached to the input port 110, another end of the cable 112 being coupled to a source of the input signal 111, for example a multi-carrier amplifier. In this example, the input signal is a spread spectrum signal comprising four carrier signals, each separated by a space. A space is an absence of a carrier signal. In a given radio standard, for example W-CDMA, a number of potential positions is provided within a predetermined band of frequencies, the positions being spectrally separated by a predetermined spectral spacing. At each of the number of locations, a carrier signal can either be present or absent, an absence of the carrier signal power being known as the "space".

In order to make an MCP measurement of the input signal 111, a user depresses (step 202) the MCP measurement key. In response to depressing the MCP measurement key, the microprocessor 102 retrieves (step 204) a default set of parameters. If the default set of parameters do not correspond to, or are not suitable for measurement of, the input signal 111, the user can alter the default set of parameters by navigating through an MCP measurement menu 300 (FIG. 3) using the "soft" keys 116, and modify default values of the default set of parameters using the array of numeric keys 114 and the enter key 118.

Figure 3:
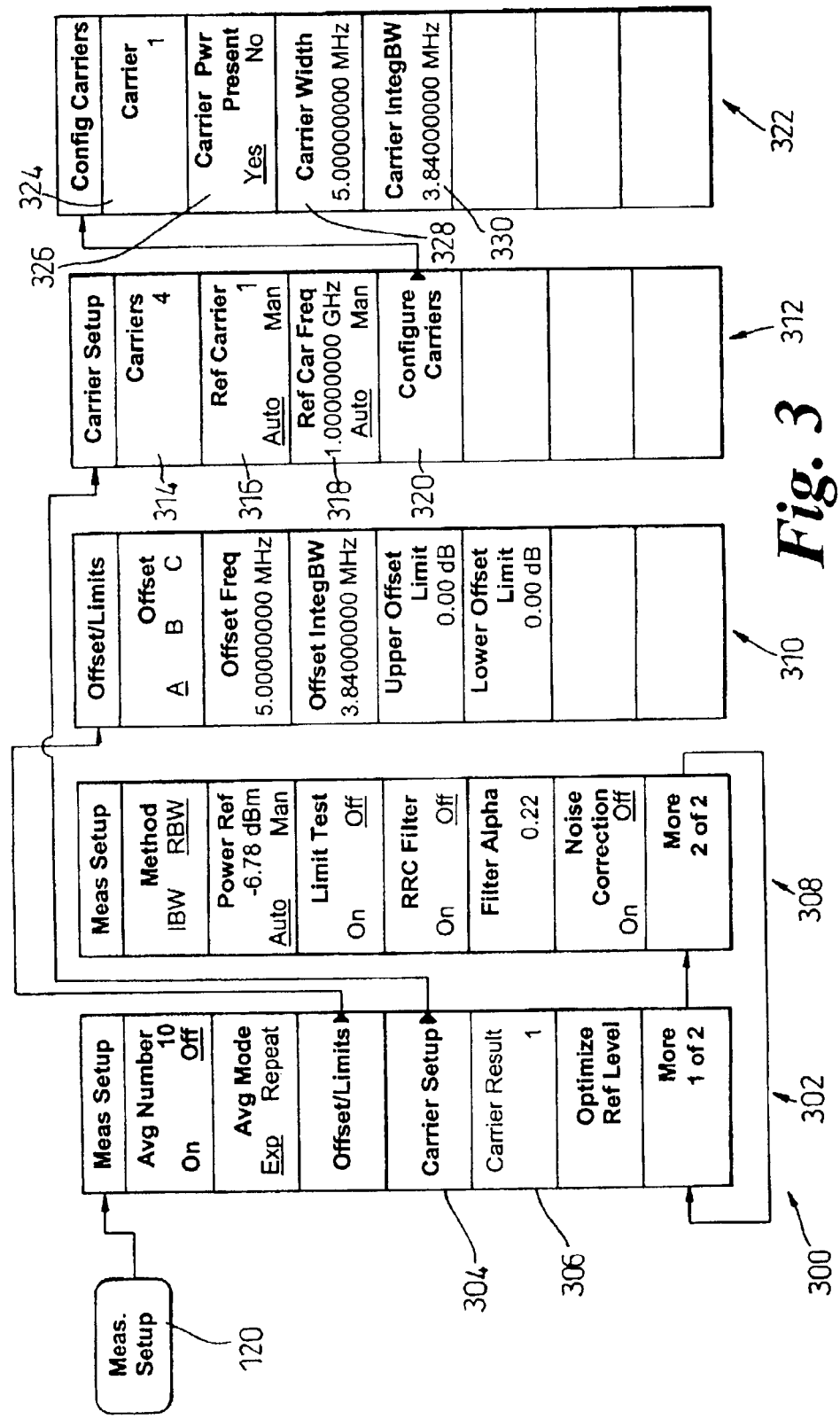
FIG. 3 is a schematic diagram of menu options for setting parameters for the apparatus of FIG. 1.

Referring to FIG. 3, the MCP measurement menu 300 comprises a plurality of options for setting measurement parameters. Some of the measurement parameters relate directly to measuring the input signal when the input signal comprises more than two carrier signals to be measured. Other measurement parameters relate generally to performing MCP measurements on any number of carrier signals and are known in the art and so require no further detailed description. Examples of such known measurement parameters can be found on the E4402 or E4440 range of spectrum analysers available from Agilent Technologies, Inc.

Figure 4:
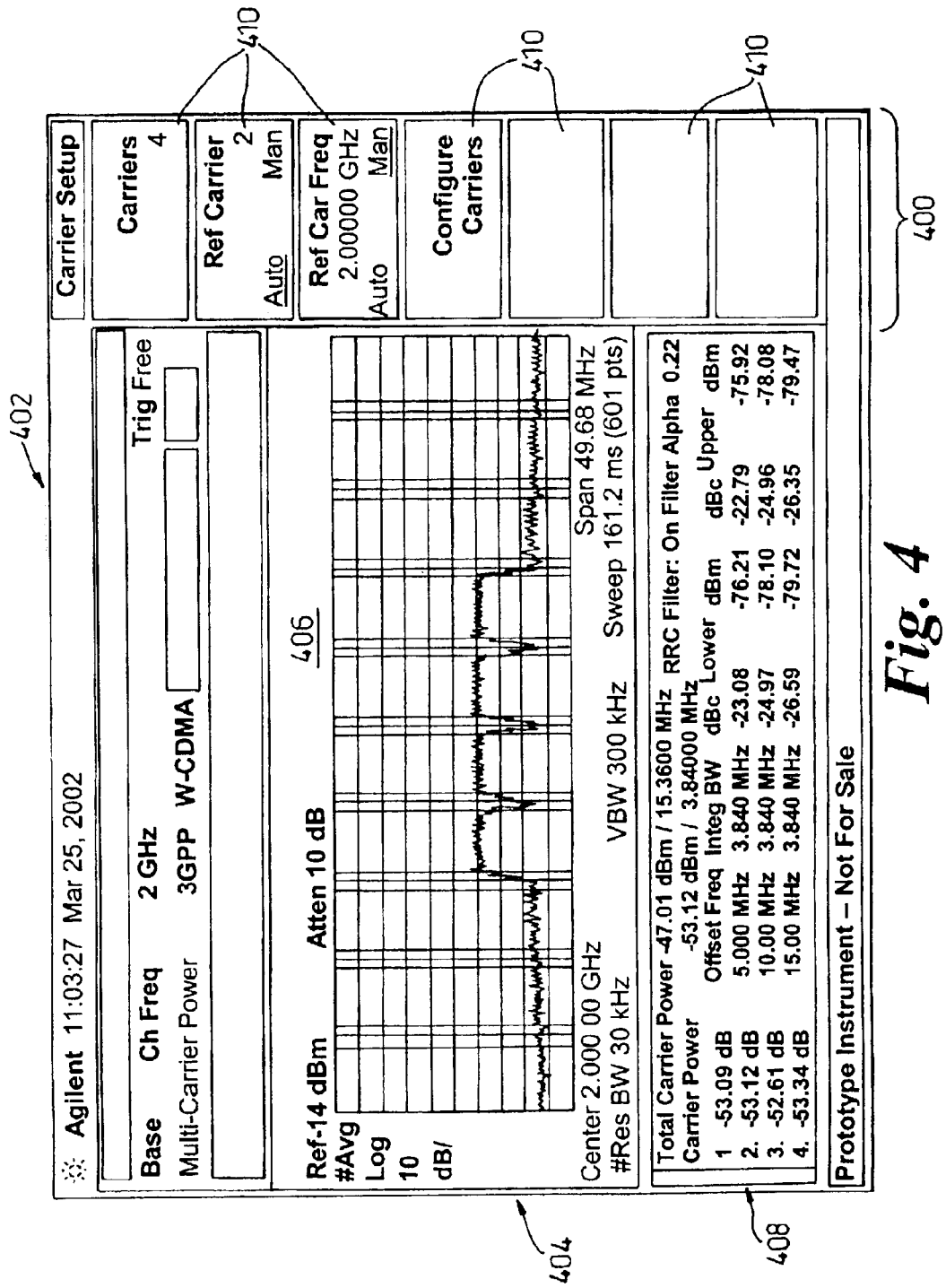
FIG. 4 is a screen-shot of the apparatus of FIG. 1, when in use.

Referring to FIG. 4, upon depression of the MCP measurement key, sets of menu options are presented to the user in the rectangular graphical menu 400 on the right hand side of a window 402 displayed by the CRT 104. Functionality of the soft keys 116 depends upon the menu options presented in the rectangular graphical menu 400; as the menu options change so do the respective functionalities of the soft keys 116. The window 402 also comprises a substantially central rectangular graphical frame 404 for displaying a spectrum of all, or part, of the input signal 406. Below the substantially central rectangular graphical frame 404, a results frame 408 is displayed for presenting the user with results of the MCP measurement.

As mentioned above, upon an initial depression of the MCP measurement key, menu options are presented to the user, a first set of menu options 302 being for configuring measurement of power. Each option of the first set of menu options 302 is presented in a separate panel 410 in the menu frame 400. The first set of menu options 302 differ from a known first set of menu options of the E4402 or E4440 range of spectrum analysers in that a carrier set-up panel 304 is provided and a "carrier result" panel 306 is provided, the carrier result panel 306 being used for scrolling through results displayed in the results frame 408. The first set of menu options permit the user to select and edit: a second set of menu options 308 for further configuration of the measurement process, and a third set of menu options 310 for configuration of offsets, bands of frequencies that flank the carrier signals. The configuration parameters in the first, second and third menu options 302, 308, 310 are known from the E4402 and E4440 range of spectrum analysers and so will not be described further herein.

In accordance with a test scheme devised by the user requiring the execution of the MCP measurement, the user configures the known measurement parameters contained in the first, second and third sets of menu options 302, 308, 310 in a manner known in the art. By selecting the carrier set-up panel 306 from the first set of menu options, 302, the user is presented with a fourth set of menu options 312 for configuring the MCP measurement to perform MCP measurements in respect of a number of carrier signals, for example, more than two carrier signals. The fourth set of menu options 312 comprises a first panel 314 for selecting a number of carrier signals from the input signal to be measured. A second panel 316 permits selection of one of the carrier signals from the number of carrier signals as a reference carrier signal; a specific carrier signal can be selected, or the spectrum analyser 100 can be set to automatically select the reference carrier signal, by selection of the most powerful carrier signal from the number of carrier signals. A third panel 318 permits the user to manually select a central frequency of the reference carrier signal, or permit the spectrum analyser 100 to select the central frequency of the reference carrier signal. A fourth panel 320 permits the user to access a fifth set of menu options 322 for configuring each carrier signal of the number of carrier signals. It should be appreciated that spaces can also be considered as very low power carrier signals, if requires, for the purpose of measurement.

A configuration setting is provided for each potential location, for example, for a carrier signal, selection of a particular potential location being achieved using a fifth panel 324. Each potential location can be accessed by scrolling through entries using the fifth panel 324. Once a particular potential location has been selected using the fifth panel 324, a carrier power present flag, a carrier signal bandwidth setting and an integration bandwidth setting are respectively presented to the user in a sixth panel 326, a seventh panel 328 and an eighth panel 330.

The carrier power present flag of the sixth panel 326 is used to inform the spectrum analyser 100 that the particular potential location is either a space, or contains a carrier signal. Irrespective of whether or not the particular potential location comprises the space or the carrier signal, a carrier signal bandwidth can be attributed to the particular potential location by making an appropriate entry in the seventh panel 328 using the numeric keys 114. The power at the particular location within the carrier signal bandwidth can therefore still be measured, if required. Similarly, for the purpose of measuring the power of the carrier signal or space in the particular potential location, a (carrier signal) integration bandwidth can be provided by making an appropriate entry in the eighth panel 330 using the numeric keys 114. The above data entry steps can be repeated for each potential location in order to configure each potential location for measurement of the input signal.

Referring back to FIG. 2, once completion of configuration of the potential locations has been determined (step 206), the settings of the set of parameters made to configure the potential locations are applied (step 208) by the spectrum analyser 100, otherwise if the default settings have not been altered, the default settings are employed.

In accordance with the settings, the spectrum analyser 100 sweeps (step 210) the predetermined band of frequencies and again determines (step 212) whether the default settings have been altered. If the default settings have been altered by the user, the settings made by the user to configure the potential locations are applied (step 208) by the spectrum analyser 100 and the spectrum analyser 100 performs the sweep (step 210) once more. If it is determined that the settings have not been altered since the execution of the sweep, the spectrum analyser 100 measures (step 214) the power for each carrier signal/space and any selected offsets in accordance with the MCP measurement method known in the art. Once the MCP measurement has been completed, the spectrum analyser 100 determines (step 216), once again, whether the settings of the set of parameters have been altered. If the settings have been altered, steps 208 to 214 are repeated, otherwise the spectrum analyser 100 displays (step 218) the results of the MCP measurement in the results frame 408. The spectrum analyser then determines (step 220) whether repeated sweeps are to be carried out, and if so, steps 210 to 218 are repeated, otherwise the MCP measurement is completed.

Although, in the above example, configuration parameters have been set in order to carry out the MCP measurement in respect of the input signal containing more than two carrier signals, it should be appreciated that the principle of configuring individual potential locations is applicable to measurements of other quantities.

Alternative embodiments of the invention can be implemented as a computer program product for use with a computer system, the computer program product being, for example, a series of computer instructions stored on a tangible data recording medium, such as a diskette, CD-ROM, ROM, or fixed disk, or embodied in a computer data signal, the signal being transmitted over a tangible medium or a wireless medium, for example microwave or infrared. The series of computer instructions can constitute all or part of the functionality described above, and can also be stored in any memory device, volatile or non-volatile, such as semiconductor, magnetic, optical or other memory device.

What is claimed is:

1. A measuring apparatus comprising:
    a spectrum analysis unit having an input for receiving an input signal to be measured, the input signal comprising a carrier signal located within a predetermined band of frequencies; wherein
    the spectrum analysis unit is arranged to store a set of user definable parameters comprising the location of the carrier signal within the predetermined band of frequencies, and to use the set of user definable parameters to measure a quantity associated with the carrier signal.

2. An apparatus as claimed in claim 1, wherein the set of user definable parameters further comprises a bandwidth of the carrier signal.

3. An apparatus as claimed in claim 1, wherein the set of user definable parameters further comprises a measurement bandwidth, the spectrum analysis unit being arranged to measure the quantity substantially over the measurement bandwidth.

4. An apparatus as claimed in claim 1, wherein the set of user definable parameters further comprises an identification of the set of parameters.

5. An apparatus as claimed in claim 1, wherein the set of user definable parameters further comprises an indication of the presence of the carrier signal at the location within the predetermined band of frequencies.

6. An apparatus as claimed in claim 1, wherein the set of user definable parameters further comprises an identification that the carrier signal is a reference carrier signal.

7. An apparatus as claimed in claim 1, wherein the set of user definable parameters further comprises an identification of a frequency corresponding to a location of a reference carrier signal.

8. An apparatus as claimed in claim 1, wherein the input signal comprises more than two carrier signals, the set of user definable parameters further comprising respective locations of the more than two carrier signals within the predetermined band of frequencies.

9. An apparatus as claimed in claim 1, wherein the quantity associated with the carrier signal to be measured is power.

10. A method of measuring for a measuring apparatus comprising a spectrum analysis unit having an input for receiving an input signal to be measured, the method comprising the following steps:
    receiving an input signal, the input signal comprising a carrier signal located within a predetermined band of frequencies;
    storing a set of user definable parameters comprising the location of the carrier signal within the predetermined band of frequencies; and
    using the set of user definable parameters to measure a quantity associated with the carrier signal.

11. A spectrum analyser comprising:
    a spectrum analysis unit having an input for receiving an input signal to be measured, the input signal comprising a carrier signal located within a predetermined band of frequencies; wherein
    the spectrum analysis unit is arranged to store a set of user definable parameters comprising the location of the carrier signal within the predetermined band of frequencies, and to use the set of user definable parameters to measure a quantity associated with the carrier signal.

12. A computer program product comprising:

a computer useable medium having a computer readable code means embodied thereon for measuring, the computer readable program code comprising:

computer readable program code means for causing the computer to receive an input signal, the input signal comprising a carrier signal located within a predetermined band of frequencies;

computer readable program code means for causing the computer to store a set of user definable parameters comprising the location of the carrier signal within the predetermined band of frequencies; and computer readable program code meaps for causing the computer to use the set of user definable parameters to measure the quantity associated with the carrier signal.

13. A program storage device readable by a machine, tangibly embodying a program of instructions executable by the machine to perform method steps for measuring, said method steps comprising:

receiving an input signal, the input signal comprising a carrier signal located within a predetermined band of frequencies;

storing a set of user definable configurable parameters comprising the location of the carrier signal within the predetermined band of frequencies; and using the set of user definable parameters to measure the quantity associated with the carrier signal.

* * * * *